(12) United States Patent
Okamoto et al.

(10) Patent No.: US 6,680,241 B2
(45) Date of Patent: Jan. 20, 2004

(54) METHOD OF MANUFACTURING SEMICONDUCTOR DEVICES BY DIVIDING WAFER INTO CHIPS AND SUCH SEMICONDUCTOR DEVICES

(75) Inventors: Tadahiro Okamoto, Kawasaki (JP); Hirohisa Matsuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/735,476

(22) Filed: Dec. 14, 2000

(65) Prior Publication Data

US 2002/0014661 A1 Feb. 7, 2002

(30) Foreign Application Priority Data

Jul. 25, 2000 (JP) ......................... 2000-224245

(51) Int. Cl.[7] ................. H01L 21/301; H01L 21/46; H01L 21/78; H01L 21/44
(52) U.S. Cl. ................. 438/464; 438/465; 438/114; 438/127
(58) Field of Search ................. 438/460, 462, 438/461, 463, 464, 465, 113–115, 106, 118, 124–127, 33, 83, 451, 68; 257/782, 735, 687

(56) References Cited

U.S. PATENT DOCUMENTS 4,172,907 A * 10/1979 Mones et al. ................. 427/96
5,547,906 A * 8/1996 Badehi ................. 438/109
6,337,122 B1 * 1/2002 Grigg et al. ................. 428/195
6,420,211 B1 * 7/2002 Brunet et al. ................. 438/113

FOREIGN PATENT DOCUMENTS

| JP | 55-124244 | * | 9/1980 | ................. 438/465 |
| JP | 56-167351 | * | 12/1981 | ................. 438/464 |
| JP | 4-58547 | * | 2/1992 | ................. 438/464 |
| JP | 4-340251 | * | 11/1992 | ................. 438/464 |
| JP | 05-218196 A | | 8/1993 | |
| JP | 6-085057 | * | 3/1994 | ................. 438/465 |
| JP | 2000068239 A | * | 3/2000 | ......... H01L/21/301 |
| WO | WO 200042653 | * | 7/2000 | ........... H01L/21/78 |

* cited by examiner

Primary Examiner—Shouxiang Hu
(74) Attorney, Agent, or Firm—Armstrong, Kratz, Quintos, Hanson & Brooks, LLP

(57) ABSTRACT

A plurality of chips divided from a semiconductor wafer having a plurality of semiconductor integrated circuits formed on a front surface of the wafer, are prepared, front surfaces of the chips being bonded to a first wafer sheet. The back and side surfaces of each chip bonded to the first wafer sheet are covered with a reinforcing thin film. Each of the plurality of chips is removed from the first wafer sheet. The flexural strength of a chip can be suppressed from being lowered by chipping and chip cracks.

7 Claims, 6 Drawing Sheets

METHOD OF MANUFACTURING SEMICONDUCTOR DEVICES BY DIVIDING WAFER INTO CHIPS AND SUCH SEMICONDUCTOR DEVICES

This application is based on Japanese Patent Application 2000-224245, filed on Jul. 25, 2000, the entire contents of which are incorporated herein by reference.

BACKGROUND OF THE INVENTION a) Field of the Invention

The present invention relates to a semiconductor device manufacture method and a semiconductor device, and more particularly to a method of manufacturing semiconductor devices by dividing a wafer into chips and such semiconductor devices.

b) Description of the Related Art

In the manufacture processes of semiconductor integrated circuit devices, a process of grinding (back grind) and polishing the back surface of a semiconductor wafer formed with electronic circuits is performed in some cases. With this process, a semiconductor chip can be thinned to a desired thickness.

During grinding and polishing the back surface of a semiconductor wafer, micro cracks may be formed on the back surface of the semiconductor wafer because of mechanical stresses during grinding and polishing. If the semiconductor wafer is divided into a plurality of chips under this condition, chipping and chip cracks are likely to be formed. Chipping and chip cracks formed in a chip lower the flexural strength of the chip. The flexural strength is lowered considerably particularly when the chip is made thin.

SUMMARY OF THE INVENTION

It is an object of the present invention to provide a semiconductor device manufacture method and semiconductor devices, capable of suppressing a flexural strength of a chip from being lowered by chipping and chip cracks.

According to one aspect of the present invention, there is provided a method of manufacturing a semiconductor device, comprising the steps of: preparing a plurality of chips divided from a semiconductor wafer having a plurality of semiconductor integrated circuits formed on a front surface of the wafer, front surfaces of the chips being bonded to a first wafer sheet; covering a back surface and side surfaces of each chip bonded to the first wafer sheet, with a reinforcing thin film; and removing each of the plurality of chips from the first wafer sheet.

According to another aspect of the present invention, there is provided a semiconductor device comprising: a semiconductor chip having an integrated circuit formed on a front surface of the semiconductor chip; and a reinforcing thin film covering a back surface opposite to the front surface, and side surfaces of the semiconductor chip.

Since the back surface and side surfaces of the chip are covered with the reinforcing thin film, the mechanical strength of the chip can be increased. If a semiconductor wafer is thinned by grinding it, the mechanical strength of a chip is lowered by micro cracks or the like. Therefore, the reinforcing thin film is effective particularly when a semiconductor wafer is ground thinner.

DETAILED DESCRIPTION OF THE PREFERRED EMBODIMENTS

With reference to FIGS. 1A to 2C, a semiconductor device manufacture method according to the first embodiment of the invention will be described.

Figure 1A:
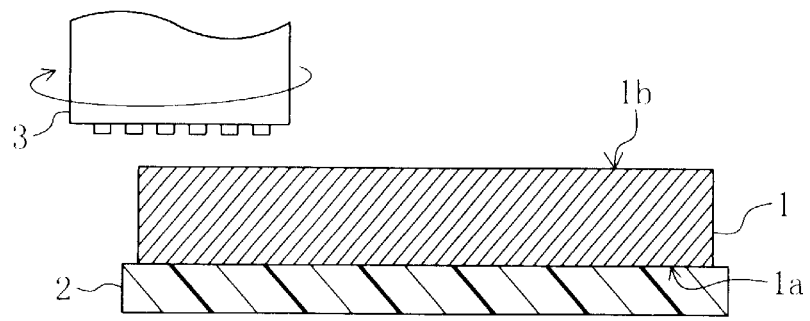
FIGS. 1A to 1G are cross sectional views illustrating some processes of a semiconductor device manufacture method according to a first embodiment of the invention.

As shown in FIG. 1A, a wafer sheet 2 is bonded to the front surface 1a of a silicon wafer on which a plurality of semiconductor integrated circuits were formed. For example, the diameter of the silicon wafer is about 20 cm (8 inches) and the thickness is about 725 $\mu$m. The back surface 1b of the silicon wafer 1 is ground with a grindstone 3. Thereafter, the back surface 1b is polished by polishing liquid which contains diamond or alumina polishing particles having a diameter of about 0.1 $\mu$m. Hydrofluoric acid or the like may be contained in the polishing liquid for chemical polishing purposes.

Figure 1B:
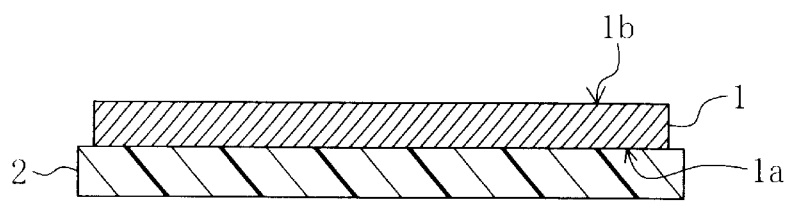

FIG. 1B is a cross sectional view of the silicon waver 1 and wafer sheet 2 after the grinding and polishing process. The thickness of the silicon wafer 1 after the grinding and polishing is, for example, 200 to 550 $\mu$m.

Figure 1C:
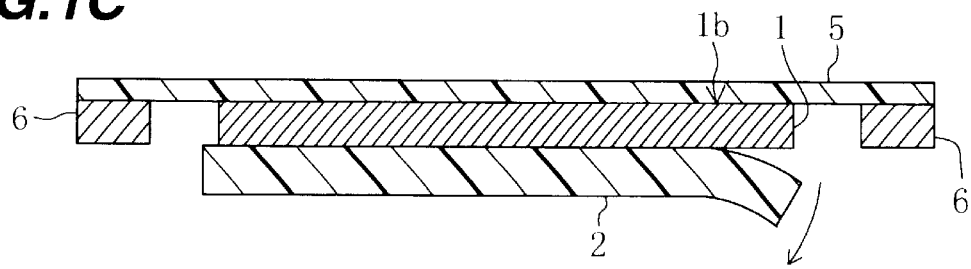

As shown in FIG. 1C, a wafer sheet 5 is bonded to the bottom surface 1b of the silicon wafer 1. The wafer sheet 5 has a size larger than that of the silicon wafer 1 and a stainless frame 6 formed on the outer peripheral area. This frame 6 of a ring shape physically supports the wafer sheet 5. After the wafer sheet 5 is bonded, the other wafer sheet 2 is removed from the silicon wafer 1.

The processes up to the state shown in FIG. 1D will be described. The silicon wafer 1 is diced along scribe lines formed on the front surface 1a. The silicon wafer 1 is therefore divided into a plurality of chips 1c. A wafer sheet 10 with a frame 11 is bonded to the front surfaces of the chips 1c. After the wafer sheet 10 is bonded, the other wafer sheet 5 is removed from the chips 1c.

Under the condition that each chip 1c is bonded to the wafer sheet 10, the back surface and side surfaces of each chip 1c are lightly etched by using aqueous solution of hydrofluoric acid, sodium hydroxide, potassium hydroxide or the like. This etching can remove chip cracks before chipping and foreign matters attached during grinding. A surface damage layer formed during grinding and dicing can also be removed. Instead of the wet etching, dry etching may be performed to lightly etch the bottom surface 1b and side surfaces of each chip 1c by using $O_2$ or $CF_4$.

Instead of light etching, ultrasonic cleaning may be performed. Ultrasonic cleaning can remove chip cracks before chipping and foreign matters attached during grinding.

Figure 1D:
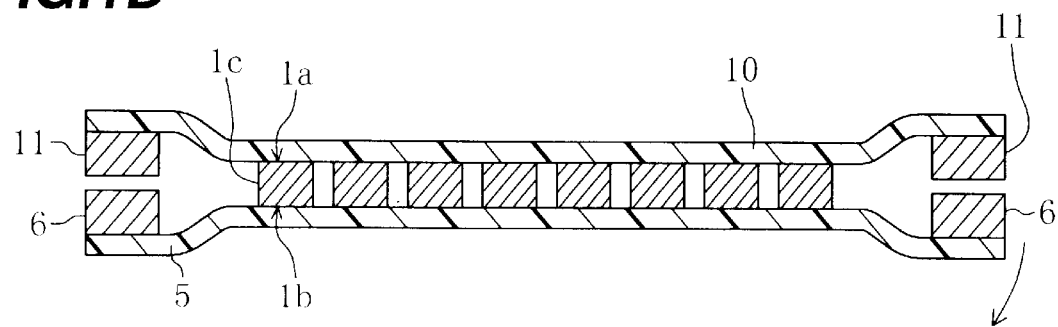
Figure 1E:
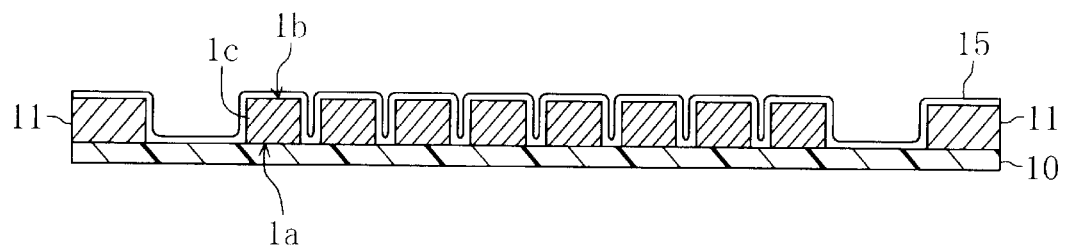

As shown in FIG. 1E, solution of polyimide dissolved in organic solvent is spin-coated on the back surface 1b and side surfaces of each chip 1c and on the exposed surface of the wafer sheet 10. For example, the thickness of the coated layer is set to 0.5 µm. Heat treatment is performed for 30 minutes to one hour at 150° C. to pre-cure polyimide. A reinforcing thin film 15 is therefore formed which is made of polyimide and has a thickness of about 0.5 µm. A gap between divided chips 1c is about 35 to 70 µm. The reinforcing thin film 15 does not therefore fill the gap completely and has a shape conformal to the back surface and side surfaces of each chip 1c.

Before polyimide solution is spin-coated, the wafer sheet 10 may be pulled and extended to broaden the gap between chips 1c to about 0.2 to 0.3 mm. By broadening the gap, polyimide solution can be spin-coated more reliably to the side surfaces of each chip 1c. If the gap between chips 1c is filled with polyimide, this polyimide filled in the gap can be removed by exposing and developing the reinforcing thin film 15 from the wafer sheet 10 side.

Figure 1F:
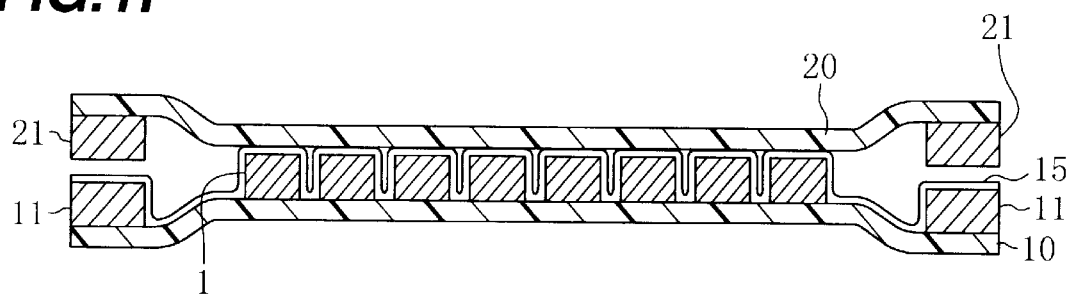

As shown in FIG. 1F, a wafer sheet 20 with a frame 21 is bonded to the reinforcing thin film 15 formed on the back surfaces 1b of the chips 1c, and the wafer sheet 10 is removed from the chips 1c. If the wafer sheet 10 is of an ultraviolet curing type, the wafer sheet 10 can be removed easily by applying ultraviolet rays to the wafer sheet.

Figure 1G:
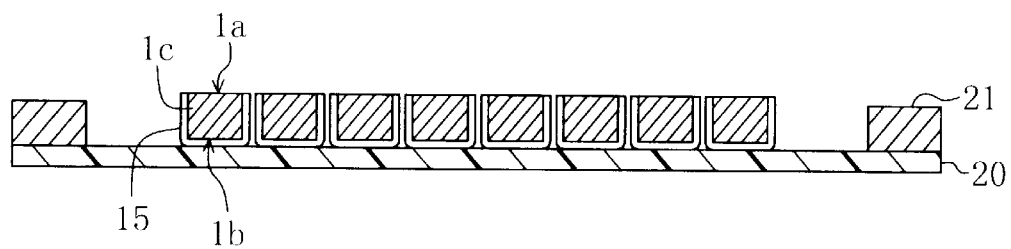

As shown in FIG. 1G, a plurality of chips 1c adhered to the wafer sheet 20 are obtained. Each chip 1c is detached from the wafer sheet 20 by plunging it up. Thereafter, the reinforcing thin film 15 of polyimide is post-cured.

Figure 2A:
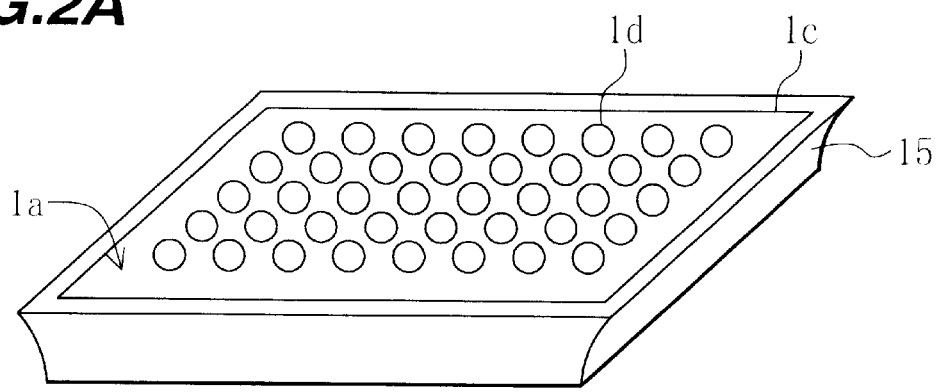
FIGS. 2A and 2B are perspective views of a semiconductor device manufactured by the first embodiment method.

FIG. 2A is a perspective view of a chip 1c as viewed from the front surface 1a side. A plurality of pads 1d are formed on the front surface 1a of the chip 1c. The back surface and side surfaces of the chip 1c are covered with the reinforcing thin film 15. The reinforcing thin film 15 gradually increases its thickness on the side surfaces of the chip 1c, from the back surface toward the front surface. This is because of viscosity of the polyimide solution which was spin-coated to form the reinforcing thin film 15 described with FIG. 1E.

Figure 2B:
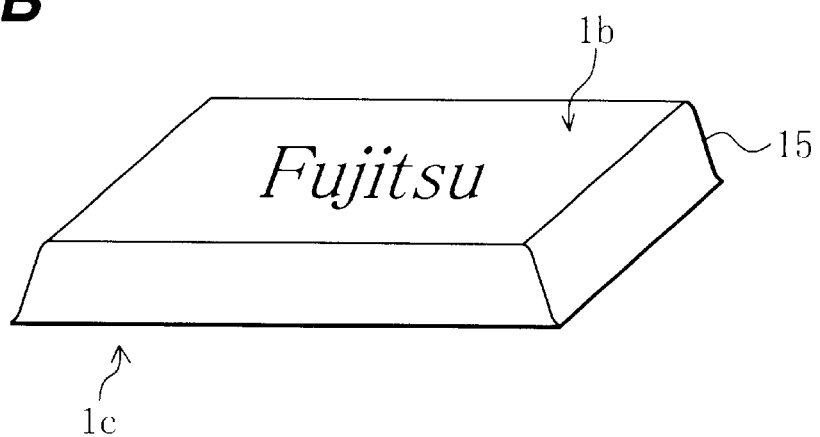

FIG. 2B is a perspective view of the chip 1c as viewed from the back surface 1b side. Characters and marks such as a company name, a product number and a lot number are printed on the surface of the reinforcing thin film 15 covering the back surface 1b of the chip 1c. Since the reinforcing thin film 15 is made of resin, these characters and marks can be printed by an inexpensive printing or ink jet printing method. Instead of printing, engraving with a laser beam may be used. Although a green laser beam is necessary for direct engraving on a silicon substrate, a laser beam such as a $CO_2$ laser and an Nd:YAG laser can be used for engraving on the reinforcing thin film 15.

Figure 2C:
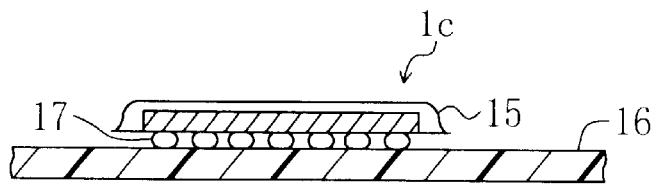
FIG. 2C is a cross sectional view of a semiconductor device mounted on a multi-layer wiring board.

FIG. 2C is a cross sectional view showing a chip 1c mounted on a multi-layer wiring board 16. The chip 1c is mounted on the multi-layer wiring board 16 via solder balls 17. The reinforcing thin film 15 does not contact the multi-layer wiring board 16.

The chip 1c formed by the first embodiment method has the back surface 1b and side surfaces covered with the reinforcing thin film 15. Therefore, even if the chip 1c has chipping and chip cracks, the flexural strength can be suppressed from being lowered by these chipping and chip cracks and a sufficient mechanical strength can be retained.

In the first embodiment described above, polyimide is used as the material of the reinforcing thin film 15. Other resins having a high adhesive force to silicon may be used. It is preferable to use resin having a post-curing heat treatment temperature of 400° C. or lower. For example, silicone resin, benzocyclobutene resin, polyolefin resin or the like may be used.

In the first embodiment, although the thickness of the reinforcing thin film 15 is set to about 0.5 µm, a different thickness may be used if it is sufficient for retaining a necessary mechanical strength. It is generally sufficient if the thickness is 0.2 µm or thicker. If the reinforcing thin film 15 is too thick, the gap between chips 1c is completely filled with the reinforcing thin film 15 formed through spin-coating described with FIG. 1E. If the gap is completely filled, it is difficult to divide the wafer into a plurality of chips at the later process. It is therefore preferable to set the thickness of the reinforcing thin film 15, to 10 µm or thinner.

In the first embodiment, although a silicon wafer is used, semiconductor wafers other than the silicon wafer may also be used.

Next, the measured values of mechanical strengths of chips manufactured by the first embodiment method will be described. The back surface of a semiconductor wafer used was ground to a thickness of 100 µm. The measured value of the actual thickness was 106 µm. A reinforcing thin film used was made of benzocyclobutene resin.

A plurality of samples A, B and C were formed. The sample A was formed at 1500 rpm of the spin-coating process described with FIG. 1E, the sample B was formed at 4000 rpm, and the sample C was formed without the reinforcing thin film. Average film thicknesses of the reinforcing thin films of the samples A and B were 49 µm and 14 µm. The chip of each sample was a square having a side length of 8 mm.

The flexural strength of each sample was evaluated through a three-point bending test. A distance between lower support points was set to 5.6 mm and a test speed was set to 1 mm/min. For the samples A, an average flexural strength was 4.5 N and a standard deviation was 0.42. For the samples B, an average flexural strength was 4.4 N and a standard deviation was 0.55. For the samples C, an average flexural strength was 2.4 N and a standard deviation was 0.27.

It is appreciated that the flexural strength of a chip with the reinforcing thin film is increased by about 1.8 times that of a chip without the film.

Next, with reference to FIGS. 3A and 3B, a semiconductor device manufacture method according to the second embodiment of the invention will be described.

Figure 3A:
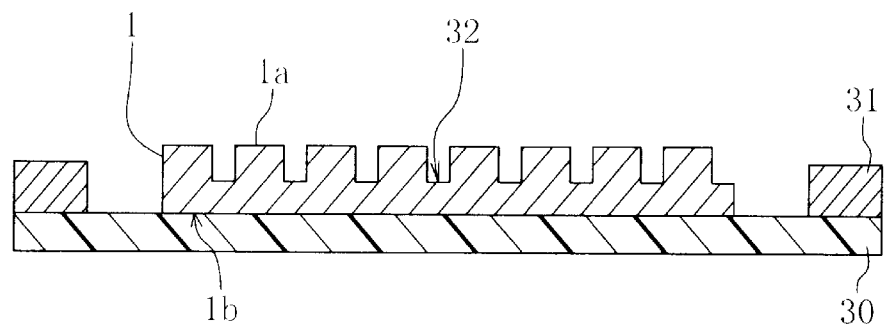
FIGS. 3A and 3B are cross sectional views illustrating some processes of a semiconductor device manufacture method according to a second embodiment of the invention.

As shown in FIG. 3A, a wafer sheet 30 with a frame 31 is bonded to the back surface 1b of a silicon wafer 1. The front surface 1a of the silicon wafer 1 is diced along scribe lines to form grooves 32. The groove 32 is slightly deeper than the thickness of a final chip and does not reach the back surface 1b of the silicon wafer 1. For example, the depth of the groove 32 is 300 to 350 µm. The silicon wafer 1 may be diced by directly sucking it to a dicing stage, without bonding the wafer sheet 30. A wafer sheet without a frame may be used.

Figure 3B:
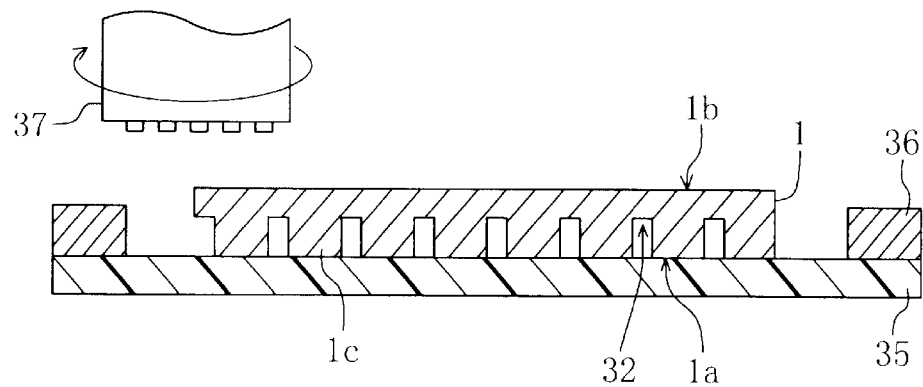

As shown in FIG. 3B, a wafer sheet 35 with a frame 36 is bonded to the front surface 1a of the silicon wafer 1, and the other wafer sheet 30 is removed. The silicon wafer 1 is ground with a grindstone 37 from the back surface 1b side until the groove 32 is exposed, and then it is polished. With these processes, the silicon wafer 1 is divided into a plurality of chips 1c. The succeeding processes are similar to those of the first embodiment described with FIGS. 1E to 1G.

In the first embodiment, grooves for dividing the silicon wafer into a plurality of chips pass through the whole thickness of the silicon wafer 1 during the dicing process described with FIG. 1D. When these grooves pass through the silicon wafer 1, chip cracks are likely to be formed near at the edges of the grooves on the back surface 1b side. In the second embodiment, since the groove 32 shown in FIG. 3A are not formed passing through the whole thickness of the silicon wafer 1, it is possible to reduce the number of chip cracks.

Next, with reference to FIGS. 4A to 4C, a semiconductor device manufacture process according to the third embodiment will be described.

Figure 4A:
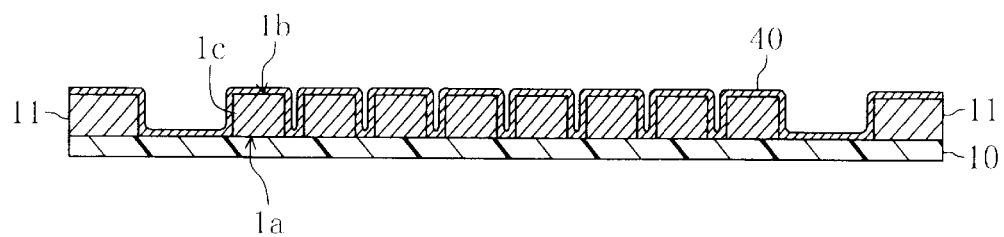
FIGS. 4A to 4C are cross sectional views illustrating some processes of a semiconductor device manufacture method according to a third embodiment of the invention.

FIG. 4A shows the state similar to that of the first embodiment described with reference to FIG. 1E. In the first embodiment, the reinforcing thin film 15 of polyimide is formed by spin-coating. In the third embodiment, a metal film 40 is formed in place of the reinforcing thin film 15. The metal film 40 is made of metal which can form alloy of silicon and the metal, such as titanium, indium and tungsten, and has a thickness of 0.1 to 0.2 μm. The metal film 40 may be formed by vacuum deposition, sputtering, chemical vapor deposition or the like. The metal film 40 may also be formed by coating low melting point metal paste such as indium paste, heating it to about 160° C. and melting it.

Figure 4B:
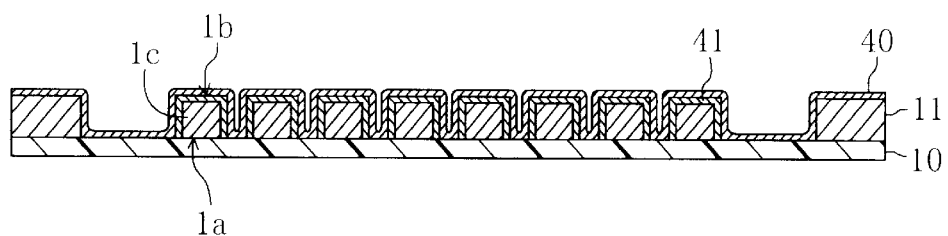

As shown in FIG. 4B, an alloy layer 41 of elements of the metal film 40 and silicon is therefore formed at the interface between the chip 1c and metal film 40. If the metal film 40 is made of indium, heat treatment at 200° C. is performed so that an InSi alloy layer 41 can be formed.

Figure 4C:
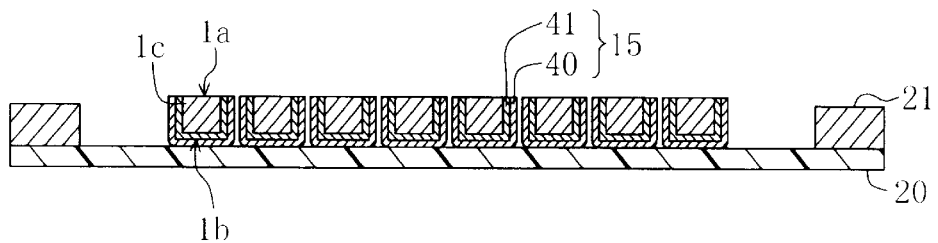

As shown in FIG. 4C, a wafer sheet 20 with a frame 21 is bonded to the metal layer 40 covering the back surface 1b of each chip 1c, and the other wafer sheet 10 is removed. The back surface 1b and side surfaces of each chip 1c are covered with a reinforcing thin film 15 having a two-layered structure of the alloy layer 41 and metal layer 40. Each chip 1c is detached from the wafer sheet 20 by plunging it up.

Small chipping and chip cracks of the chip 1c can be buried with the alloy layer when this layer is formed. The flexural strength can therefore be increased.

In the third embodiment, the reinforcing thin film 15 is made of two layers of the alloy layer 41 and metal layer 40. The flexural strength can be expected to be increased even if the reinforcing thin film is made of other inorganic materials such as titanium oxide, silicon oxide, titanium nitride and silicon nitride. These inorganic material film can be formed by electron beam vapor deposition, sputtering, chemical vapor deposition or the like.

Next, with reference to FIG. 5, a semiconductor device manufacture method according to the fourth embodiment of the invention will be described. In the first embodiment, the reinforcing thin film 15 is formed by the spin-coating process described with FIG. 1B. In the fourth embodiment, a reinforcing thin film is formed by a method different from the first embodiment, and other processes are similar to those of the first embodiment.

Figure 5:
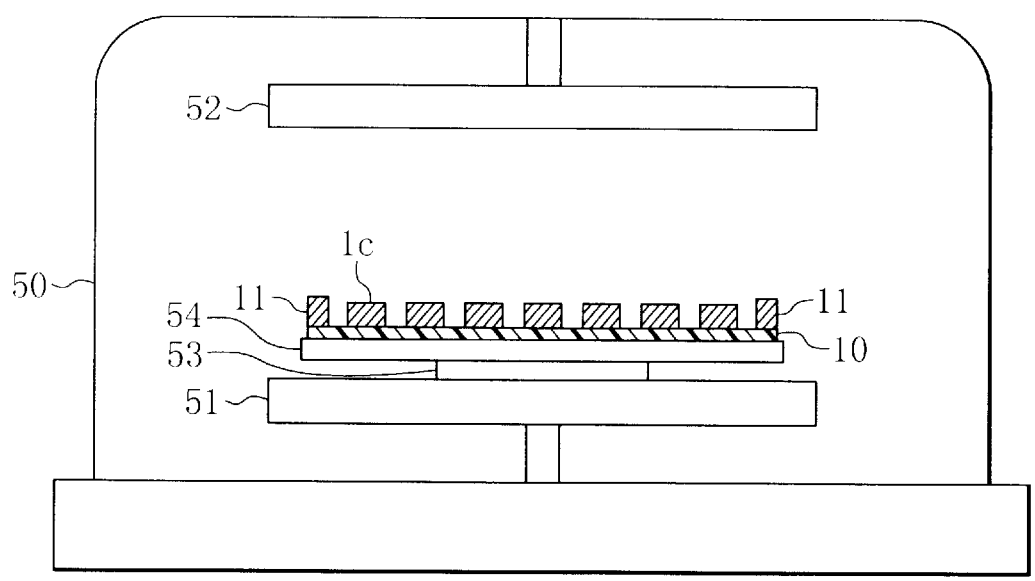
FIG. 5 is a schematic cross sectional view of a thin film forming system used by a semiconductor device manufacture method according to a fourth embodiment of the invention.

FIG. 5 is a schematic cross sectional view of a reinforcing thin film forming system used by the fourth embodiment method. A cathode 51 is disposed on the bottom of a chamber 50, and an anode 52 is disposed on the top of the chamber 50. A stage 54 is mounted above the cathode 51, with a spacer 53 being interposed therebetween. A wafer sheet 10 and a plurality of chips 1c bonded to the sheet are placed on the upper surface of the stage 54. The wafer sheet 10 has a ring-shaped frame 11 at the outer periphery of the sheet 10.

The inside of the chamber 50 is evacuated to a pressure of about 0.01 Pa, and ethylene and methane are introduced into the chamber at a partial pressure ratio of 1:1. A d.c. voltage of about 5 kV to 15 kV is applied between the cathode 51 and anode 52 to generate d.c. glow discharge. A negative glow region is formed near at the cathode 51. This discharge is maintained for about 15 minutes at a current value of 5 mA. A polymerized film having a thickness of about 0.4 μm is therefore formed on the back surface 1b and side surfaces of each chip 1c. This polymerized film has a high adhesive force to silicon and a high rigidity. This polymerized film is used as the reinforcing thin film 15 shown in FIG. 1G.

The present invention has been described in connection with the preferred embodiments. The invention is not limited only to the above embodiments. It is apparent that various modifications, improvements, combinations, and the like can be made by those skilled in the art.

What is claimed is:

1. A method of manufacturing a semiconductor device, comprising the steps of:

Preparing a plurality of chips divided from a semiconductor wafer having a plurality of semiconductor integrated circuits formed on a front surface of the wafer, front surfaces of the chips being bonded to a first wafer sheet;

covering a back surface and side surfaces of each chip of said plurality of chips bonded to the first wafer sheet with a reinforcing thin film;

exposing the reinforcing thin film from the first wafer sheet side and developing the reinforcing thin film; and removing each of the plurality of chips from the first wafer sheet.

2. A method of manufacturing a semiconductor device according to claim 1, wherein said step of removing each of the plurality of chips comprises the steps of:

bonding a second wafer sheet to back surfaces of the chips covered with the reinforcing thin film;

removing the first wafer sheet from the plurality of chips; and removing each of the plurality of chips from the second wafer sheet.

3. A method of manufacturing a semiconductor device according to claim 1, wherein said step of covering the front and side surfaces of each chip comprises:

coating resin solution containing resin components dissolved therein on the back surface and side surfaces of each chip bonded to the first wafer sheet; and curing the coated resin solution.

4. A method of manufacturing a semiconductor device according to claim 1, wherein the reinforcing thin film is made of resin selected from a group consisting of polyimide, silicone resin, benzocyclobutene resin, and polyolefin resin.

5. A method of manufacturing a semiconductor device according to claim 4, further comprising a step of printing a character or a mark on the reinforcing thin film with ink.

6. A method of manufacturing a semiconductor device according to claim 4, further comprising a step of engraving a character or a mark on the reinforcing thin film by applying a laser beam onto the reinforcing thin film.

7. A method of manufacturing a semiconductor device according to claim 1, further comprising a step of etching the back surface and side surfaces of each chip before said step of covering the back surface and side surfaces with the reinforcing thin film.

* * * * *